(12) United States Patent
Sugikawa

(10) Patent No.: US 6,507,186 B1
(45) Date of Patent: Jan. 14, 2003

(54) TEST AND REPAIR SYSTEM, PRODUCT MANUFACTURING SYSTEM, MEMBER TEST APPARATUS, DATA PROCESSING APPARATUS, MEMBER REPAIR APPARATUS, AND INFORMATION STORAGE MEDIUM

(75) Inventor: Yutaka Sugikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 20 days.

(21) Appl. No.: 09/714,676

(22) Filed: Nov. 16, 2000

(30) Foreign Application Priority Data

Nov. 25, 1999 (JP) .......................................... 11-334654

(51) Int. Cl.$^7$ ................................................ G01R 1/04
(52) U.S. Cl. ................................................... 324/158.1
(58) Field of Search ............................... 324/754, 760, 324/765, 158.1; 438/4, 6, 14, 15, 106, 109, 601, 622; 714/7, 31, 710, 711, 718, 719, 723, 733, 738; 365/145, 189.01, 200, 201, 230.3

(56) References Cited

U.S. PATENT DOCUMENTS 5,568,408 A * 10/1996 Maeda ........................ 364/580
5,697,751 A * 12/1997 Takahashi .................... 414/222
5,987,632 A * 11/1999 Irrinki et al. ................ 714/711
6,247,597 B1 * 6/2001 Sato ............................ 206/710
6,288,561 B1 * 9/2001 Leedy .......................... 324/760

FOREIGN PATENT DOCUMENTS

| EP | 0 292 236 | 11/1988 | ........... H01L/21/00 |
| EP | 0 844 645 | 5/1998 | ........... H01L/21/00 |
| GB | 1 568 854 | 6/1980 | ........... G05B/15/02 |
| JP | 61-236136 | 10/1986 | ........... H01L/21/68 |

* cited by examiner

*Primary Examiner*—N. Le
*Assistant Examiner*—Etienne LeRoux
(74) *Attorney, Agent, or Firm*—Hayes Soloway PC

(57) ABSTRACT

In a test and repair method with a test and repair system of the present invention, even when a defect is found in some of a plurality of members to be processed transferred collectively on a member transfer jig, the defective member to be processed is transferred and repaired while it is mounted on the member transfer jig. The condition of the defect occurrence in the member transfer jig is set in processing state data with a member test apparatus. The processing state data is transferred to a data processing apparatus from the member test apparatus. Repair instruction data in accordance with the processing state data is transmitted from the data processing apparatus to a member repair apparatus.

8 Claims, 9 Drawing Sheets

| SLOT NUMBER | 1 | 2 | 3 | ... | 24 | 25 |
|---|---|---|---|---|---|---|
| PROCESSING STATUS | 3 | 3 | 1 | ... | 1 | 1 |

FIG. 4a

| PROCESSING STATUS | MEANING IN MEMBER TEST APPARATUS |
|---|---|
| 0 | NO WAFER |
| 1 | TEST WAFER |
| 2 | WAFER TESTED AND FOUND DEFECTIVE |
| 3 | WAFER TESTED AND FOUND ACCEPTABLE |
| 4 | WAFER WITHOUT TEST |
| 5 | DISCARDED WAFER |

FIG. 4b

| PROCESSING STATUS | MEANING IN MEMBER REPAIR APPARATUS |
|---|---|
| 0 | NO WAFER |
| 1 | REPAIR WAFER |
| 2 | WAFER REPAIRED AND FOUND DEFECTIVE AGAIN |
| 3 | WAFER REPAIRED |
| 4 | WAFER WITHOUT REPAIR |
| 5 | DISCARDED WAFER |

FIG. 4c

| WAFER NUMBER | 1 | 2 | 3 | ... | 24 | 25 |
|---|---|---|---|---|---|---|
| SLOT NUMBER | 1 | 2 | 3 | ... | 24 | 25 |

FIG. 6

| WAFER NUMBER | 1 | 2 | 3 | ... | 24 | 25 |
|---|---|---|---|---|---|---|
| SLOT NUMBER | 1 | 2 | 3 | ... | 24 | 25 |
| PROCESSING STATUS | 1 | 4 | 4 | ... | 4 | 1 |

FIG. 7

TEST AND REPAIR SYSTEM, PRODUCT MANUFACTURING SYSTEM, MEMBER TEST APPARATUS, DATA PROCESSING APPARATUS, MEMBER REPAIR APPARATUS, AND INFORMATION STORAGE MEDIUM

BACKGROUND OF THE INVENTION

1. Field of the Invention

The present invention relates to a test and repair system and a test and repair method for testing a plurality of members to be processed mounted at plurality of member mounting positions of a member transfer jig, respectively, to determine whether each of them is favorable or defective and for repairing a member to be processed which is determined as defective, a member test apparatus and a member test method for testing a plurality of members to be processed mounted at a plurality of member mounting positions of a member transfer jig, respectively, to determine whether each of them is acceptable or defective, a data processing apparatus and a data processing method for communicating data with the member test apparatus, a member repair apparatus and a member repair method for communicating data with the data processing apparatus, and an information storage medium for storing programs as software for causing a computer to execute various processing operations.

2. Description of the Related Art

At present, circuit products such as LSIs (Large Scale Integrated circuit) are manufactured by forming semiconductor circuits on a silicon wafer, and improvements are desired in the integration degree and productivity. At a typical site of manufacturing, various operations are managed on the basis of a unit referred to as operation lot for mass-producing such circuit products as planned with high yields.

For example, when one operation lot is set to include 25 silicon wafers, each manufacturing carrier serving as a member transfer jig is also provided with 25 holding slots serving as member mounting positions such that each silicon wafer serving as a member to be processed is removably mounted in each of the holding slots. Since the transfer of such manufacturing carriers allows silicon wafers to be moved in operation lots, a number of silicon wafers can be processed in operation lots.

At the site of manufacturing where a number of silicon wafers are moved in operation lots with the manufacturing carrier in this manner, various manufacturing processing apparatuses are arranged along the manufacturing line for individually performing a number of manufacturing steps, and the silicon wafers are transferred in operation lots to each of the manufacturing processing apparatuses with the manufacturing carrier.

At such a manufacturing site, unique identification data is provided to each of a number of silicon wafers, a plurality of operation lots, and a plurality of manufacturing carriers, and identification data is provided to each of a plurality of holding slots for each manufacturing carrier. The operation states are managed on the basis of the identification data.

Since current highly-integrated circuit products require frequent tests in the manufacturing process, various member test apparatuses are disposed at respective positions along the aforementioned manufacturing line. Such a member test apparatus comprises test supporting means including guide rails or robot arms which removably support a manufacturing carrier to be tested.

A plurality of silicon wafers mounted on the manufacturing carrier thus supported are tested by quality determining means to determine whether each of them is acceptable or defective, and if all the silicon wafers mounted on one manufacturing carrier are determined as acceptable, the manufacturing carrier is transferred to the next manufacturing processing apparatus along the manufacturing line.

If any defective silicon wafer is found by the member test apparatus, however, the identification data of the manufacturing carrier and the holding slot associated with the wafer are displayed on a display of the member test apparatus, for example. In this case, an operator who recognized the displayed data on the display of the member test apparatus once removes the manufacturing carrier from the manufacturing line to extract the defective silicon wafer from the holding slot associated therewith, and mounts the defective silicon wafer on another repair carrier to newly set an operation lot dedicated to repair.

For example, when all the holding slots of the repair carrier are loaded with silicon wafers, the repair carrier is transferred to a member repair apparatus arranged independently of the manufacturing line. The member repair apparatus also comprises repair supporting means including guide rails or the like which removably support the repair carrier.

All the silicon wafers mounted on the repair carrier thus supported are repaired in sequence by the member repair apparatus. The repair carrier with its silicon wafers all repaired is again subjected to a test by an operator using the member test apparatus, for example, to ensure the completion of the repair.

The repair carrier in which the completion of the repair is ensured for all the silicon wafers is again transferred to the manufacturing line by an operator, and the silicon wafers are returned to the holding slots of the original manufacturing carriers from the repair carrier. The manufacturing carriers are returned to the manufacturing line since only acceptable silicon wafers are mounted on the manufacturing carriers.

A silicon wafer which is determined as defective after the second test is subjected to additional repair, for example, and a silicon wafer on which a predetermined number of repairs and tests are repeated is discarded. When a silicon wafer is discarded in this manner, its manufacturing carrier is returned to the manufacturing line after another silicon wafer is replenished, for example.

At the manufacturing site where semiconductor circuits are formed on silicon wafers as described above, since a defective silicon wafer is repaired, circuit products can be mass-produced with high yields and with a minimized number of discarded silicon wafers.

The aforementioned manufacturing site, however, requires that the operator extracts the silicon wafer which has been determined as defective from the manufacturing carrier to mount it on the repair carrier and returns the silicon wafer for which repair is completed to the holding slot of the original manufacturing carrier from the repair carrier. These operations are complicated and easily cause erroneous transfer of silicon wafers.

In addition, since the repair operation is performed in operation lots similarly to the normal operation, it is necessary to form an operation lot dedicated to the repair from defective silicon wafers. As a result, the repair operation is performed only after a predetermined number of defective silicon wafers are accumulated on a repair carrier, resulting in significant delay of manufacturing operations for a manufacturing carrier in which a defective silicon wafer is present.

SUMMARY OF THE INVENTION

The present invention is made in view of the aforementioned problems, and it is an object of the present invention to provide at least one of a test and repair system and a test and repair method capable of repairing a defective silicon wafer without requiring complicated operations, a member test apparatus and a member test method in the test and repair system and method, a data processing apparatus and a data processing method in the test and repair system and method, a member repair apparatus and a member repair method in the test and repair system and method, and an information storage medium for storing programs as software for causing a computer to execute the data processing method with the data processing apparatus.

The test and repair system of the present invention comprises a member test apparatus for testing a plurality of members to be processed mounted at a plurality of member mounting positions of a member transfer jig, respectively, to determine whether each of the members is acceptable or defective, and a member repair apparatus for repairing the member to be processed which is determined as defective by the member test apparatus, and further comprises a data processing apparatus for integrating and controlling the member test apparatus and the member repair apparatus;

wherein the member test apparatus comprises:
  test supporting means for removably supporting the member transfer jig;
  quality determining means for testing the plurality of members to be processed mounted on the member transfer jig supported by the test supporting means to determine whether each of the members is acceptable or defective;
  processing storage means for storing processing state data in which each of position identification data provided for each of the plurality of member mounting positions corresponds to one of a plurality of member current state data for representing a current state of the member to be processed for each member transfer jig tested by the quality determining means;
  data update means for updating the member current state data in the processing state data stored in the processing storage means in accordance with the result of the determination by the quality determining means; and
  state transmitting means for transmitting the processing state data updated by the data update means to the data processing apparatus,
the data processing apparatus comprises:
  state receiving means for receiving the processing state data from the member test apparatus;
  data managing means for managing the processing state data received by the state receiving means; and
  repair transmitting means for transmitting repair instruction data to the member repair apparatus in accordance with the processing state data managed by the data managing means,
the member repair apparatus comprises:
  repair receiving means for receiving the repair instruction data from the data processing apparatus;
  repair supporting means for removably supporting the member transfer jig;
  repair performing means for repairing the member to be processed mounted on the member transfer jig supported by the repair supporting means; and
  repair control means for selectively controlling the repair operation of the repair performing means for each of the member mounting positions of the member transfer jig in accordance with the repair instruction data received by the repair receiving means.

Therefore, in the test and repair method with the test and repair system of the present invention, the member test apparatus tests the plurality of members to be processed mounted at the plurality of member mounting positions of the member transfer jig, respectively, to determine whether each of the members is acceptable or defective, and the member to be processed determined as defective is repaired by the member repair apparatus.

In this case, in the member test apparatus, the test supporting means removably supports the member transfer jig, the quality determining means tests the plurality of members to be processed mounted on the supported member transfer jig to determine whether each of the members is acceptable or defective. On the other hand, the processing storage means stores the processing state data in which each of the position identification data provided for each of the plurality of member mounting positions corresponds to one of the plurality of member current state data for representing a current state of the member to be processed for each member transfer jig tested by the quality determining means, the data update means updates the member current state data in the stored processing state data in accordance with the result of the determination by the quality determining means, and the state transmitting means transmits the updated processing state data to the data processing apparatus.

In the data processing apparatus, the state receiving means receives the processing state data from the member test apparatus, the data managing means manages the received processing state data, and the repair transmitting means transmits the repair instruction data to the member repair apparatus in accordance with the managed processing state data.

In the member repair apparatus, the repair supporting means removably supports the member transfer jig, and the repair performing means repairs the member to be processed mounted on the supported member transfer jig. The repair receiving means receives the repair instruction data from the data processing apparatus, and the repair control means selectively controls the repair operation of the repair performing means for each of the member mounting positions of the member transfer jig in accordance with the received repair instruction data.

In this manner, in the test and repair method with the test and repair system of the present invention, even when a defect is found in some of the plurality of members to be processed transferred collectively on the member transfer jig, the defective member to be processed is transferred and repaired while it is mounted on the member transfer jig. As a result, it is not necessary to extract the defective member to be processed from the member transfer jig for normal operation to mount it on a member transfer jig dedicated to repair.

In addition, the condition of the defect occurrence in the member transfer jig is set by the member test apparatus in the processing state data which is transferred to the data processing apparatus from the member test apparatus, thereby allowing the data processing apparatus to control the condition of the defect occurrence in the member transfer jig.

Furthermore, the defective member to be processed is transferred to the member repair apparatus while it is mounted on the member transfer jig together with acceptable members to be processed, but the member repair apparatus repairs the defective member to be processed on the basis of the repair instruction data which is transmitted corresponding to the processing state data to the member repair apparatus from the data processing apparatus.

In the test and repair system as described above, the data processing apparatus may comprise mounting managing means for managing mounting state data in which member identification data provided for respective ones of the plurality of members to be processed correspond to the position identification data for each member transfer jig, data integrating means for integrating the mounting state data with the processing state data to create integration state data, and integration managing means for managing the integration state data created by the data integrating means.

In this case, in the data processing apparatus, the mounting managing means manages the mounting state data in which the member identification data provided for respective ones of the plurality of members to be processed correspond to the position identification data for each member transfer jig, and the data integrating means integrates the mounting state data with the processing state data to create the integration state data. The integration managing means manages the created integration state data. Therefore, data can be managed with the member identification data provided respectively for the members to be processed corresponding to the member current state data for representing the current states of the members to be processed.

A product manufacturing system of the present invention, including the test and repair system according to the present invention as its part, comprises jig transfer means for sequentially transferring the member transfer jig, various types of manufacturing processing apparatuses disposed on a transfer path of the jig transfer means for performing various types of manufacturing steps on the member to be processed, respectively, and the test and repair system including the member test apparatus disposed in a stage next to a particular one of the manufacturing processing apparatuses.

Therefore, in the product manufacturing system of the present invention, since the jig transfer means sequentially transfers the member transfer jig, the various types of manufacturing processing apparatuses disposed on the transfer path perform the various types of manufacturing steps on the member to be processed, respectively. The member test apparatus in the test and repair system is disposed in the stage next to the particular one of the manufacturing processing apparatuses, and the member test apparatus tests the state of the particular manufacturing step and the member repair apparatus performs repair as required.

In the aforementioned product manufacturing system, the data processing apparatus in the test and repair system may integrate and control the manufacturing processing apparatuses. In this case, since the manufacturing processing apparatuses are integrated and controlled by the data processing apparatus, the states of the manufacturing steps for the members to be processed are also controlled as data.

The member test apparatus of the present invention, for testing a plurality of members to be processed mounted at a plurality of member mounting positions of a member transfer jig, respectively, to determine whether each of the members is acceptable or defective, comprises test supporting means for removably supporting the member transfer jig, quality determining means for testing the plurality of members to be processed mounted on the member transfer jig supported by the test supporting means to determine whether each of the members is acceptable or defective, processing storage means for storing processing state data in which each of position identification data provided for each of the plurality of member mounting positions corresponds to one of a plurality of member current state data for representing a current state of the member to be processed for each member transfer jig tested by the quality determining means, data update means for updating the member current state data in the processing state data stored in the processing storage means in accordance with the result of the determination by the quality determining means, and state transmitting means for transmitting the processing state data updated by the data update means to the outside.

The data processing apparatus of the present invention for communicating data with the member test apparatus according to the present invention comprises state receiving means for receiving the processing state data from the member test apparatus, data managing means for managing the processing state data received by the state receiving means, and repair transmitting means for transmitting repair instruction data to the outside in accordance with the processing state data managed by the data managing means.

The data processing apparatus as described above may comprise mounting managing means for managing mounting state data in which member identification data provided for respective ones of the plurality of members to be processed correspond to the position identification data for each member transfer jig, data integrating means for integrating the mounting state data with the processing state data to create integration state data, and integration managing means for managing the integration state data created by the data integrating means.

The member repair apparatus of the present invention for communicating data with the data processing apparatus according to the present invention comprises repair receiving means for receiving the repair instruction data from the data processing apparatus, repair supporting means for removably supporting the member transfer jig, repair performing means for repairing the member to be processed mounted on the member transfer jig supported by the repair supporting means, and repair control means for selectively controlling the repair operation of the repair performing means for each of the member mounting positions of the member transfer jig in accordance with the repair instruction data received by the repair receiving means.

The information storage medium of the present invention stores software readable by a computer and comprising programs for causing the computer to perform the steps of: receiving, from the outside, processing state data in which each of position identification data provided for each of a plurality of member mounting positions corresponds to one of a plurality of member current state data for representing a current state of member to be processed; managing the received processing state data; and transmitting repair instruction data to the outside in accordance with the managed processing state data.

The information storage medium as described above may further store programs for causing the computer to perform the steps of: managing mounting state data in which member identification data provided for respective ones of the plurality of members to be processed correspond to the position identification data for each member transfer jig; integrating the mounting state data with the processing state data to create integration state data; and managing the created integration state data.

The various means used in the present invention may be any which are formed to implement the respective functions. For example, dedicated hardware for producing a predetermined function, a computer provided with a predetermined function through a program, a predetermined function realized within a computer through a program, a combination thereof, and the like are allowed.

The information storage medium used in the present invention may be any hardware which previously stores programs as software for causing a computer to perform various processing. For example, ROM (Read Only Memory) and an HDD (Hard Disc Drive) which are fixed in an apparatus including a computer as its part, a CD (Compact Disc)-ROM and an FD (Floppy Disk) which are removably inserted into an apparatus including a computer as its part, and the like are allowed.

The computer used in the present invention may be any apparatus which can read programs formed of software to perform processing operations corresponding thereto. For example, an apparatus including a CPU (Central Processing Unit) as a main unit and various devices such as ROM, RAM (Random Access Memory), an I/F (interface) and the like connected to the CPU as required is allowed. As the execution of various operations corresponding to software by the computer in the present invention, the computer may control operations of various devices.

BRIEF DESCRIPTION OF THE DRAWINGS

FIGS. 4(a) to (c) are schematic diagrams showing data structures of processing state data;

FIG. 6 is a schematic diagram showing a data structure of mounting state data;

FIG. 7 is a schematic diagram showing a data structure of integration state data;

DETAILED DESCRIPTION OF THE PREFERRED EMBODIMENT

Figure 1:
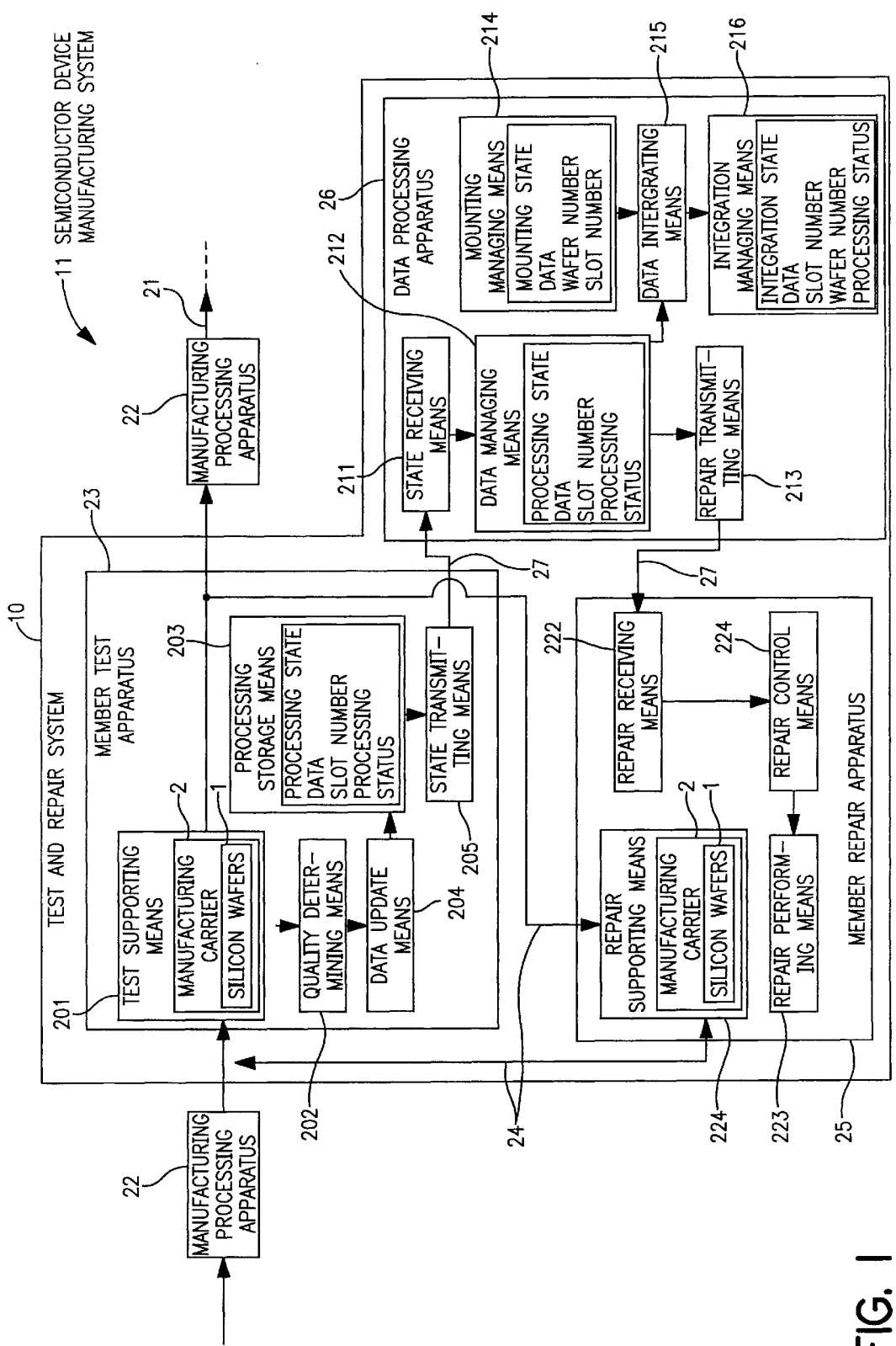
FIG. 1 is a schematic diagram showing a logical structure of a semiconductor device manufacturing system which is an embodiment of a product manufacturing system of the present invention.
Figure 5:
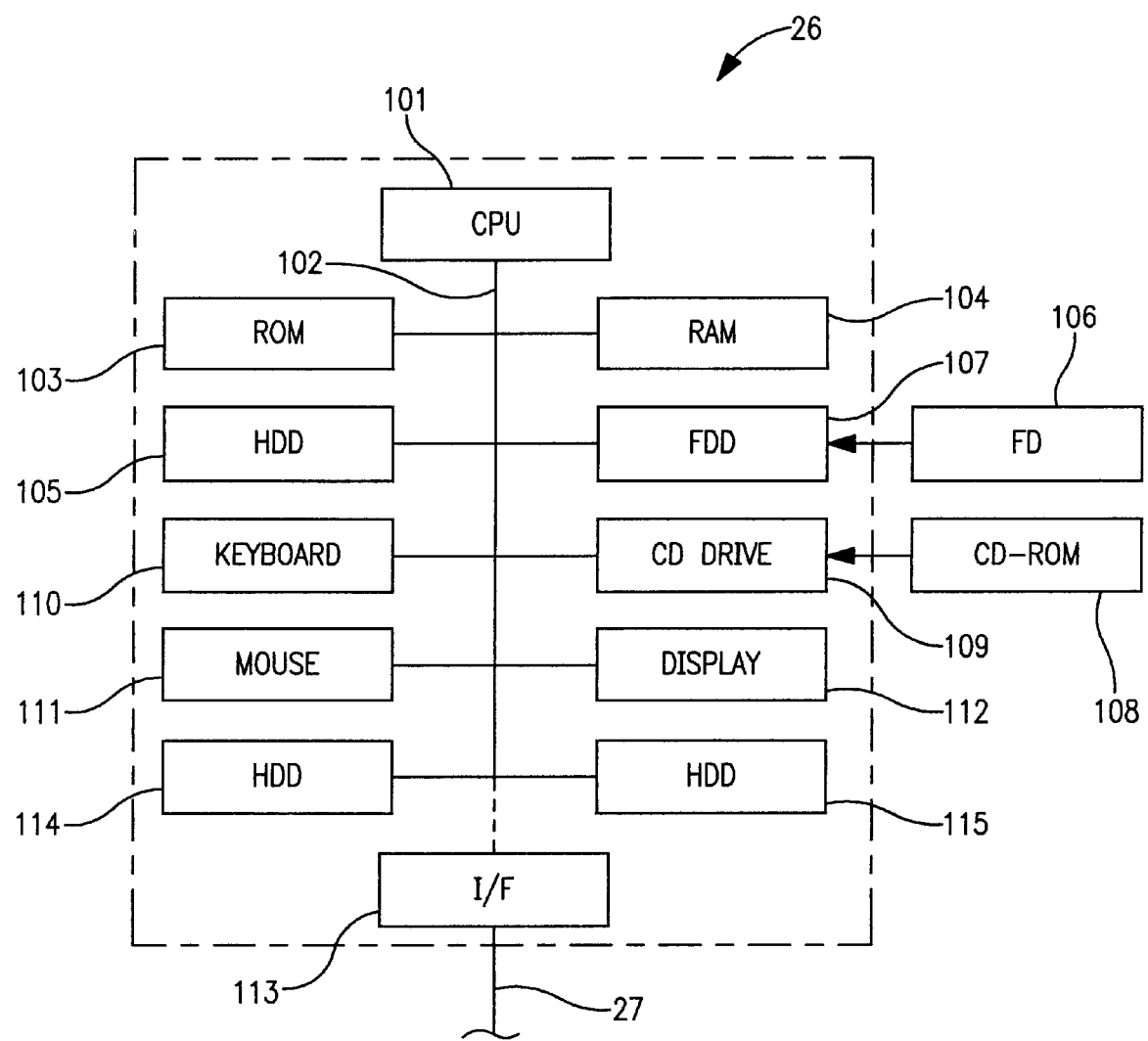
FIG. 5 is a block diagram showing a physical structure of a data processing apparatus.
Figure 8:
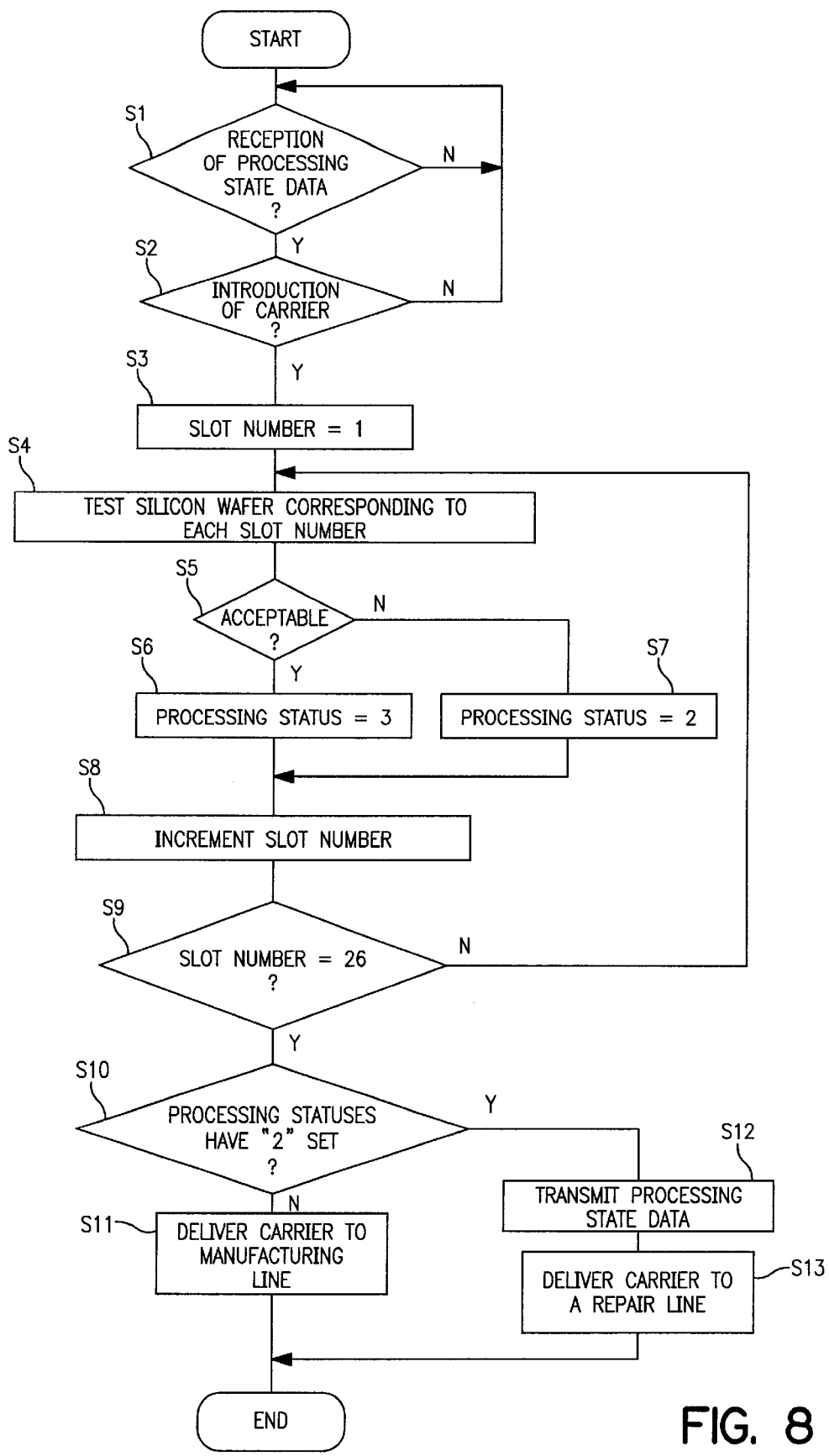
FIG. 8 is a flow chart showing processing operations of a member test apparatus.
Figure 9:
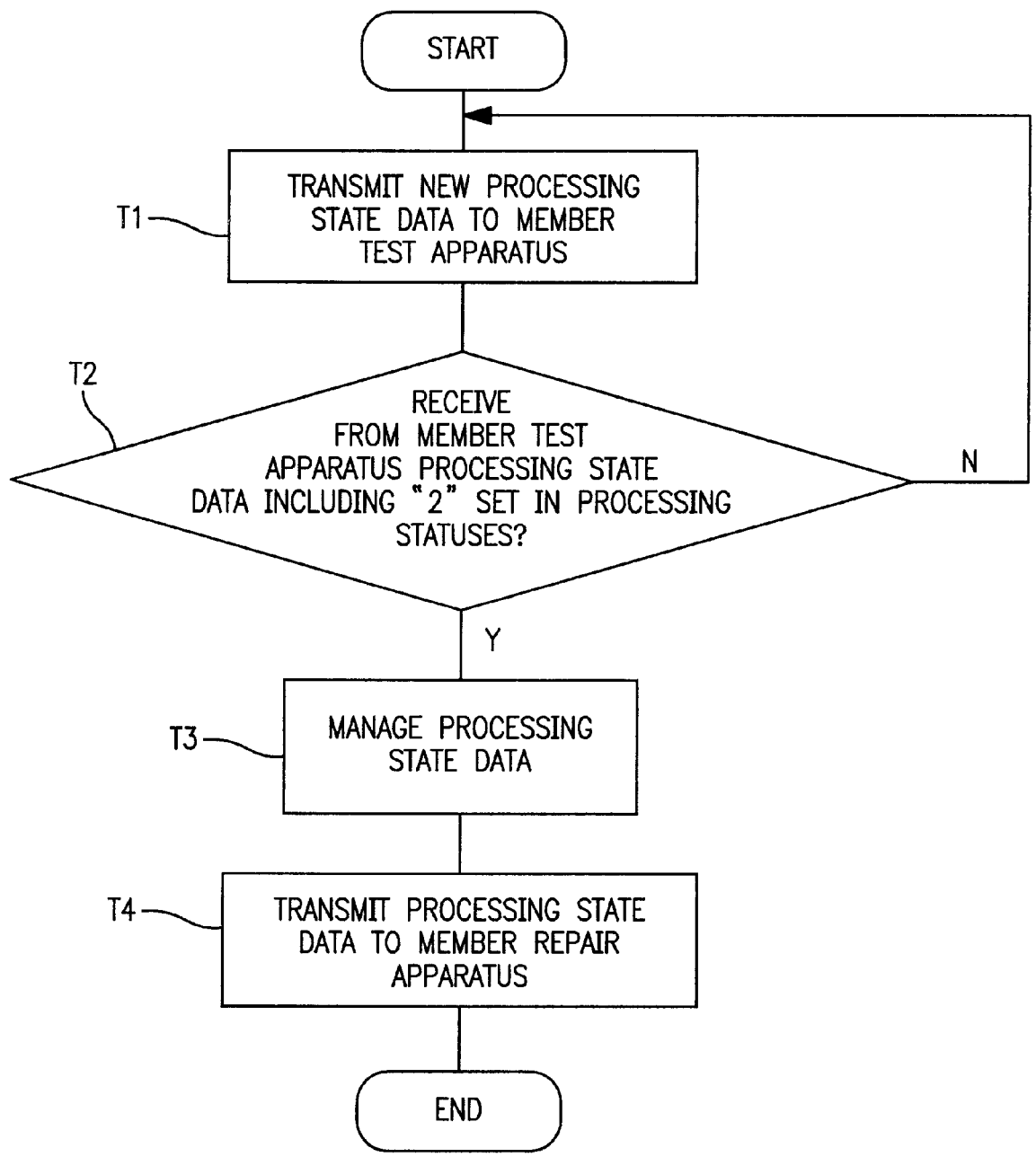
FIG. 9 is a flow chart showing processing operations of the data processing apparatus.
Figure 10:
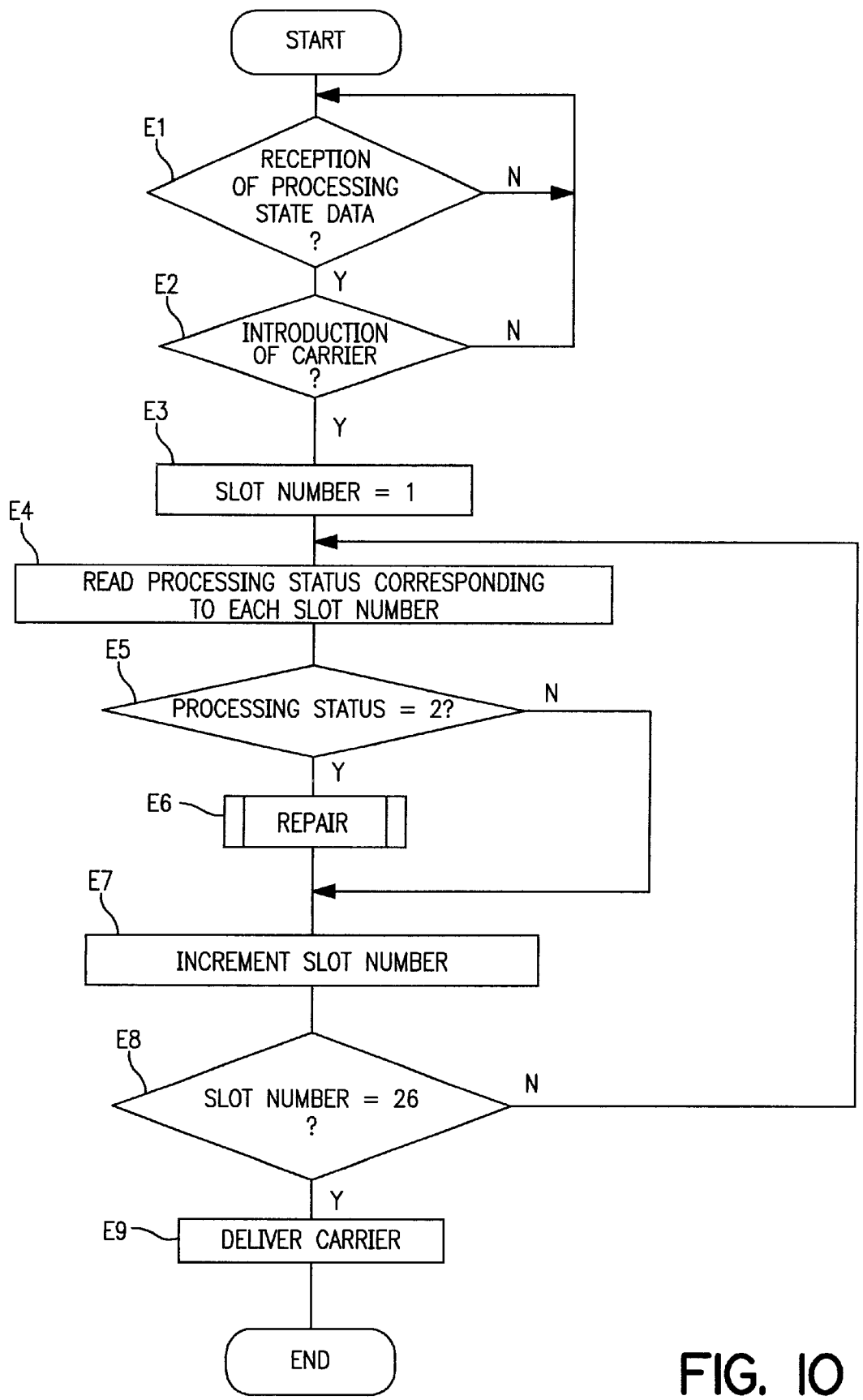
FIG. 10 is a flow chart showing processing operations of a member repair apparatus.

A preferred embodiment of the present invention is hereinafter described with reference to the drawings. FIG. 1 is a schematic diagram showing a logical structure of a semiconductor device manufacturing system which is an embodiment of a product manufacturing system of the present invention, FIG. 2 is a block diagram showing a physical structure of the semiconductor device manufacturing system, FIG. 3 is a perspective view showing appearances of a silicon wafer serving as a member to be processed and a manufacturing carrier serving as a member transfer jig, FIGS. 4(a) to (c) are schematic diagrams showing data structures of processing state data, FIG. 5 is a block diagram showing a physical structure of a data processing apparatus, FIG. 6 is a schematic diagram showing a data structure of mounting state data, FIG. 7 is a schematic diagram showing a data structure of integration state data, FIG. 8 is a flow chart showing processing operations of a member test apparatus, FIG. 9 is a flow chart showing processing operations of the data processing apparatus, and FIG. 10 is a flow chart showing processing operations of a member repair apparatus.

Figure 2:
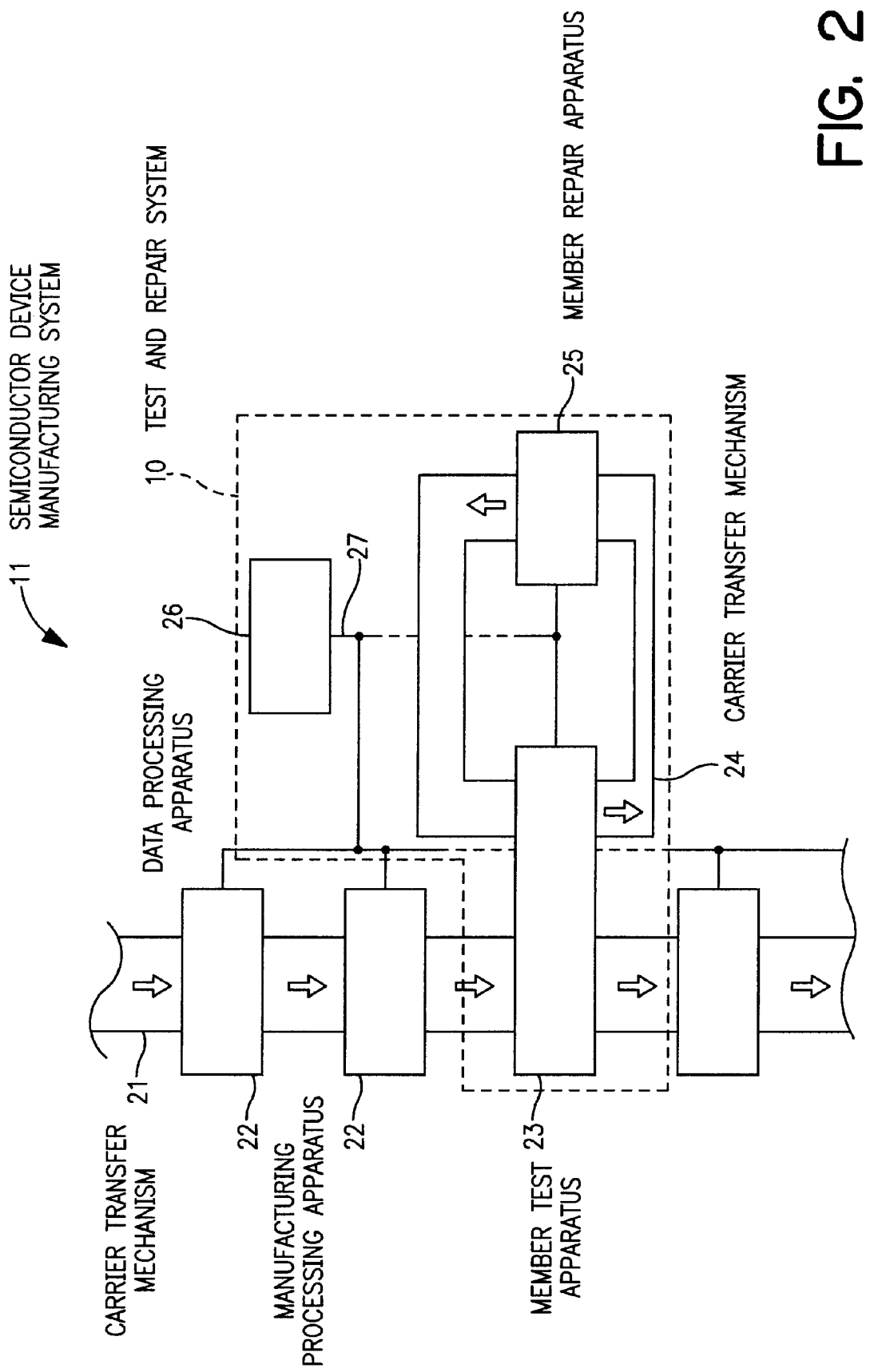
FIG. 2 is a block diagram showing a physical structure of the semiconductor device manufacturing system.

As shown in FIG. 2, test and repair system 10 which is an embodiment of a test and repair system of the present invention is incorporated integrally into semiconductor device manufacturing system 11 which is a product manufacturing system. Semiconductor device manufacturing system 11 transfers silicon wafers 1 serving as members to be processed which are mounted on manufacturing carrier 2 serving as a member transfer jig.

Figure 3:
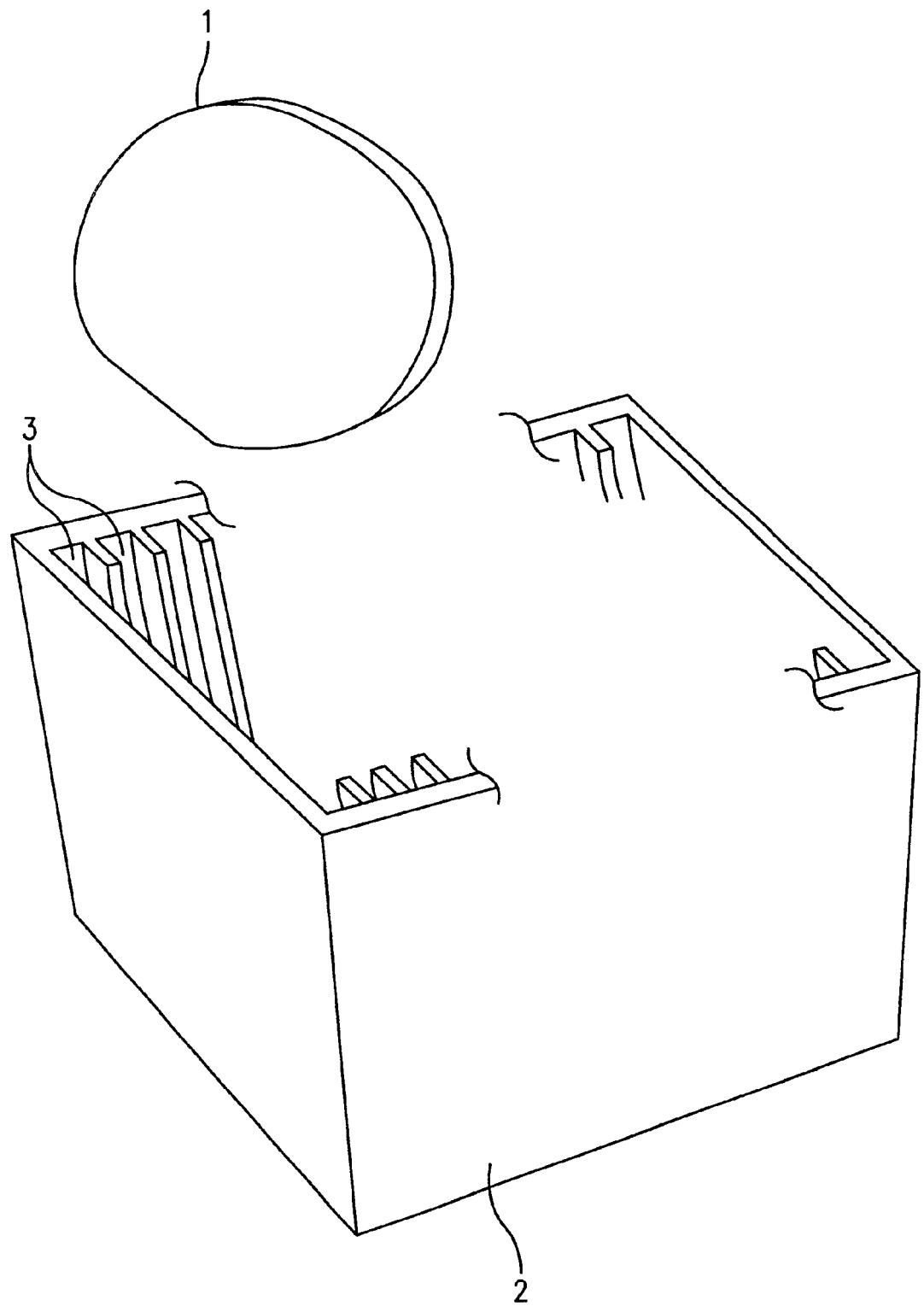
FIG. 3 is a perspective view showing appearances of a silicon wafer serving as a member to be processed and a manufacturing carrier serving as a member transfer jig.

More specifically, manufacturing carrier 2 is formed in box shape with its top opened as shown in FIG. 3 in which 25 holding slots 3 are formed as a plurality of member mounting positions at which silicon wafers 1 are individually mounted. Since 25 silicon wafers 1 are set as one operation lot in semiconductor device manufacturing system 11 of the embodiment, silicon wafers 1 for one operation lot are mounted on one manufacturing carrier 2.

Each of a number of silicon wafers 1 is provided with a wafer number serving as unique member identification data, and each of a plurality of operation lots is provided with a unique lot number. Each of a plurality of manufacturing carriers 2 is provided with a unique carrier number, and 25 holding slots 3 are provided individually with slot numbers of "1 to 25" for each manufacturing carrier 2.

Semiconductor device manufacturing system 11 comprises carrier transfer mechanism 21 which transfers manufacturing carrier 2 along a line in sequence. various manufacturing processing apparatuses 22 are disposed at respective positions along the transfer path of carrier transfer mechanism 21, and manufacturing processing apparatus 22 individually perform various manufacturing steps on silicon wafers 1.

However, member test apparatus 23 of test and repair system 10 is disposed in the stage next to particular manufacturing processing apparatus 22. Member test apparatus 23 tests a plurality of silicon wafers 1 mounted individually in a plurality of holding slots 3 of manufacturing carrier 2 to determine whether each of them is acceptable or not.

Member test apparatus 23 is connected with carrier transfer mechanism 24 in ring shape of test and repair system 10, and member repair apparatus 25 is disposed on the transfer path of carrier transfer mechanism 24. Member repair apparatus 25 repairs silicon wafer 1 which has been determined as defective by member test apparatus 23.

Carrier transfer mechanism 24 of test and repair system 10 transfers manufacturing carrier 2 including defective silicon wafer 1 found by member test apparatus 23 to member repair apparatus 25, and transfers manufacturing carrier 2 discharged from member repair apparatus 25 to member test apparatus 23.

Semiconductor device manufacturing system 11 of the embodiment comprises one data processing apparatus 26 which is connected through communication network 27 to each of aforementioned manufacturing processing apparatuses 22, member test apparatus 23, member repair apparatus 25, and carrier transfer mechanisms 21 and 24. Data processing apparatus 26 communicates data with the aforementioned various apparatuses such as apparatuses 22 and the like through communication network 27 to integrate and control these apparatuses such as apparatuses 22.

As shown in FIG. 1, member test apparatus 23 comprises test supporting means 201 including guide rails or robot arms which removably support manufacturing carrier 2. In addition, member test apparatus 23 comprises hardware (not shown) such as a microcomputer, an optical scanner, and a communication I/F, for example, and the microcomputer is equipped with predetermined control programs.

In member test apparatus 23 of the embodiment, the microcomputer performs various operations in accordance with the equipped control programs to logically realize various means such as quality determining means 202, processing storage means 203, data update means 204, state transmitting means 205, and the like.

Quality determining means 202 corresponds to functions of the microcomputer to control the operation of the optical scanner and to perform operational processing for output data in accordance with the control programs and the like. Specifically, quality determining means 202 tests a plurality of silicon wafers 1 mounted on manufacturing carrier 2 supported by test supporting means 201 to determine whether each of them is favorable or not.

In this quality test, a circuit pattern of an integrated circuit formed on the surface of silicon wafer 1 at the immediately preceding step is optically read, and the read data is compared with design data of the circuit pattern for pattern matching, thereby testing the circuit pattern formed on the surface of silicon wafer 1.

Processing storage means 203 corresponds to a storage area of an information storage medium such as RAM recognized by the microcomputer operating in accordance with the control programs. Specifically, processing storage means 203 stores processing state data such that it can be updated for each manufacturing carrier 2 tested by quality determining means 202.

The processing state data is a data file representing the processing states of silicon wafers 1 for each manufacturing carrier 2. As shown in FIG. 4(a), each of slot numbers serving as position identification data provided for each of a plurality of holding slots 3 corresponds to one of processing statuses which are a collection of member current state data for representing the current state of silicon wafer 1.

As shown in FIGS. 4(b) and (c), the aforementioned processing statuses in the processing state data are used in common for member test apparatus 23 and member repair apparatus 25, but the processing statuses are interpreted in a slightly different manner between apparatuses 23 and 25 since they perform different processing.

Data update means 204 corresponds to predetermined processing operations of the microcomputer in accordance with the control programs. Specifically, data update means 204 updates the processing statuses in the processing state data stored in processing storage means 203 based on the determination result of quality determining means 202.

State transmitting means 205 corresponds to the function of the microcomputer to control data transmission through the communication I/F in accordance with the control programs. Specifically, state transmitting means 205 transmits the processing state data updated by data update means 204 as repair instruction data to data processing apparatus 26. Since the processing state data is a data file for each manufacturing carrier 2 as described above, the processing state data is transmitted with a carrier number assigned thereto.

Data processing apparatus 26 comprises CPU 101 as hardware serving as a main unit of a computer as shown in FIG. 5. CPU 101 is connected to bus line 102 which is connected to hardware such as ROM 103, RAM 104, HDD 105, FDD (FD Drive) 107 into which FD 106 is inserted, CD drive 109 into which CD-ROM 108 is inserted, keyboard 110, mouse 111, display 112, communication I/F 113 and the like. Communication network 27 is connected to communication I/F 113.

In data processing apparatus 26 of the embodiment, hardware such as ROM 103, RAM 104, HDD 105, FD 106, CD-ROM 108 correspond to information storage media, and at least one of them stores as software the control programs and various types of data required for various operations.

For example, the control programs for causing CPU 101 to execute various processing operations are previously stored in FDD 106 or CD-ROM 108. Such software is previously installed on HDD 105, and copied to RAM 104 and read by CPU 101 at the activation of data processing apparatus 26.

CPU 101 thus reads proper programs to perform various processing operations to logically realize, as various functions, various means such as state receiving means 211, data managing means 212, repair transmitting means 213, mounting managing means 214, data integrating means 215, integration managing means 216 in data processing apparatus 26 of the embodiment as shown in FIG. 1.

State receiving means 211 corresponds to the function of CPU 101 to receive data through communication I/F 113 in accordance with the control programs in RAM 104 or the like. Specifically, state receiving means 211 receives the processing state data from member test apparatus 23. Data managing means 212 corresponds to the function of CPU 101 to store the data file in an storage area such as HDD 105 such that it can be recognized in accordance with the control programs. Specifically, data managing means 212 manages the processing state data received by state receiving means 211.

More specifically, a database is created in data managing means 212 with a large amount of processing state data corresponding to a number of manufacturing carriers 2. Data processing apparatus 26 integrates and controls manufacturing processing apparatus 22, member test apparatus 23 and the like based on the large amount of processing state data stored in the database.

When manufacturing carrier 2 is introduced to member test apparatus 23 from manufacturing processing apparatus 22, the associated processing state data is transmitted to member test apparatus 23 from data processing apparatus 26. However, when state receiving means 211 of data processing apparatus 26 receives processing state data from member test apparatus 23, data managing means 212 updates the processing state data stored in the database in accordance with the received contents.

Repair transmitting means 213 corresponds to the function of CPU 101 to control data transmission through communication I/C 113 in accordance with the control programs. Specifically, repair transmitting means 213 transmits the processing state data managed by data managing means 212 to member repair apparatus 25. Since the data transmission is performed for controlling the repair operation of member repair apparatus 25, the associated carrier number and an instruction to perform repair operation are also transmitted actually together with the processing state data.

Mounting managing means 214 corresponds to the function of CPU 101 to recognize the data file stored in the storage area such as HDD 105 in accordance with the control programs, and specifically, manages mounting state data.

The mounting state data is also a data file for each manufacturing carrier 2, and as shown in FIG. 6, slot numbers correspond to wafer numbers which are the member identification data provided individually for a plurality of silicon wafers 1.

Data integrating means 215 corresponds to predetermined processing functions of CPU 101 in accordance with the control programs, and specifically, as shown in FIG. 7, integrates the mounting state data with the processing state data to produce integration state data. Integration managing means 216 corresponds to the function of CPU 101 to recognize the data file stored in the storage area such as HDD 105 in accordance with the control programs, and specifically, manages the integration state data produced by data integrating means 215.

It should be noted that the aforementioned various means of data processing apparatus 26 are realized using hardware such as keyboard 110, display 112 and the like as required, but its main unit is realized by hardware of the computer or CPU 101 which operates in accordance with the software stored in the information storage medium such as RAM 104.

Such software is stored in the information storage medium such as RAM 104 as control programs for causing CPU 101 and the like to perform processing operations including the reception of the processing state data from member test apparatus 23 through communication I/F 113 or the like, the management of the received processing state data with HDD 105 or the like, the transmission of the managed processing state data to member repair apparatus 25 through communication I/F 113 or the like, the management of the mounting state data with HDD 105 or the like, the integration of the managed mounting state data with the processing state data by CPU 101 or the like to produce the integration state data, and the management of the produced integration state data with HDD 105 or the like.

Member repair apparatus 25 of the embodiment comprises repair supporting means 221 including guide rails or robot arms which removably support manufacturing carrier 2. Member repair apparatus 25 also comprises hardware (not shown) such as a microcomputer, a print removing unit, a communication I/F and the like, and the microcomputer is equipped with predetermined control programs.

In member repair apparatus 25 of the embodiment, the microcomputer performs various operations in accordance with the equipped control programs to logically realize various means such as repair receiving means 222, repair performing means 223, repair control means 224 and the like.

Repair receiving means 222 corresponds to the function of the microcomputer to accept the received data through the communication I/F in accordance with the control programs. Specifically, repair receiving means 222 receives the processing state data from data processing apparatus 26. Repair performing means 223 corresponds to the function of the microcomputer to control the operation of the print removing unit in accordance with the control programs, and specifically, repairs silicon wafer 1 mounted on manufacturing carrier 2 supported by repair supporting means 221.

Repair control means 224 corresponds to the function of the microcomputer to control the operation of the defective circuit removing unit in accordance with the control programs and held data. Specifically, repair control means 224 selectively controls the repair operation of repair performing means 223 for each holding slot 3 of manufacturing carrier 2 in accordance with the repair instruction data received by repair receiving means 222. When member test apparatus 23 tests the circuit pattern formed on the surface of silicon wafer 1 as described above, the repair operation of member repair apparatus 25 is performed as removal of a defective circuit pattern.

A test and repair method with test and repair system 10 of the embodiment in the aforementioned configuration is hereinafter described in conjunction with a circuit manufacturing method by semiconductor device manufacturing system 11. Semiconductor device manufacturing system 11 of the embodiment sequentially transfers plural manufacturing carriers 2 which include 25 silicon wafers 1 mounted in 25 holding slots 2, respectively, to various manufacturing processing apparatuses 22 by means of carrier transfer mechanism 21 along the manufacturing line, and performs various manufacturing steps in sequence on each of silicon wafers 1 mounted on manufacturing carriers 2, thereby forming integrated circuits.

However, in semiconductor device manufacturing system 11 of the embodiment, since member test apparatus 23 of test and repair system 10 is disposed in the stage next to particular manufacturing processing apparatus 22, member test apparatus 23 tests silicon wafer 1 after it is subjected to the particular manufacturing step to check whether it is acceptable or not.

More particularly, data processing apparatus 26 manages the processing state data in the database of data managing means 212, and the processing state data is relied on to integrate and control various manufacturing processing apparatuses 22 and member test apparatus 23.

When manufacturing carrier 2 sequentially transferred along the manufacturing line is introduced into member test apparatus 23, the processing state data of that manufacturing carrier 2 is transmitted to member test apparatus 23 from data processing apparatus 26 as shown in FIG. 8 and FIG. 9 (steps S1, T1).

Since the processing state data in the initial state thus transmitted includes all of the 25 processing statuses initialized to "1," member test apparatus 23 recognizes all of 25 silicon wafers 1 mounted on manufacturing carrier 2 as subjects to be tested.

As shown in FIG. 8, after the completion of the reception of the processing state data and the introduction of manufacturing carrier 2 (steps S1, S2), while member test apparatus 23 increments the slot numbers in the processing state data one by one from "1" to "25" (steps S3, S8, S9), it tests silicon wafer 1 in manufacturing carrier 2 corresponding to each slot number (step S4).

If the result of the test of silicon wafer 1 shows "acceptable," the processing status corresponding to the slot number of that silicon wafer 1 is changed from "1" to "3" (steps S5, S6). If the result of the test of silicon wafer 1 shows "defective," the processing status corresponding to the slot number of that silicon wafer 1 is changed from "1" to "2" (steps S5, S7).

After the completion of the test for all 25 silicon wafers 1 mounted on manufacturing carrier 2 as described above, all 25 silicon wafers 1 are "acceptable" if the processing statuses in the processing state data have no "2" set therein (step S10). Thus, member test apparatus 23 delivers manufacturing carrier 2 to the normal manufacturing line (step S11).

On the other hand, "defective" silicon wafer 1 is mounted on manufacturing carrier 2 if the processing statuses in the processing state data have any "2" set therein (step S10). Thus, member test apparatus 23 transmits the processing state data to data processing apparatus 26 (step S12), and delivers manufacturing carrier 2 to a repair line (step S13).

As shown in FIG. 9, after data processing apparatus 26 receives from member test apparatus 23 the processing state data including "2" set in the processing statuses (step T2), it updates the stored contents in data managing means 212 with the received processing state data and manages the updated data (step T3), and transmits the processing state data to member repair apparatus 25 (step T4) as repair instruction data corresponding to the managed processing state data.

As shown in FIG. 10, member repair apparatus 25 receives from data processing apparatus 26 the processing state data as the repair instruction data (step E1). When manufacturing carrier 2 corresponding to that data is introduced (step E2), while member repair apparatus 25 increments the slot numbers in the processing state data one by one from "1" to "25," it searches for any processing status "2" (steps E3, E5, E7, and E8). When any processing status "2" is found, it repairs silicon wafer 1 in holding slot 3 corresponding thereto (step E6).

After member repair apparatus 25 repairs all of silicon wafers 1 with the processing status "2" as described above, it delivers manufacturing carrier 2 for those silicon wafers 1 to the repair line (step E9). Thus, that manufacturing carrier 2 is again introduced into member test apparatus 23 with carrier transfer mechanism 24 of test and repair system 10.

Member test apparatus 23 again tests repaired silicon wafers 1, and if all wafers 1 are "acceptable," delivers manufacturing carrier 2 to the manufacturing line. If any "defective" is found, however, the aforementioned operations are repeated.

Since semiconductor device manufacturing system 11 of the embodiment transfers silicon wafers 1 mounted on manufacturing carrier 2 as described above, integrated circuits can be manufactured from silicon wafers 1 in lots. Silicon wafers 1 in the manufacturing process are automatically tested for the integrated circuits by member test apparatus 23, and any silicon wafer 1 in which a defect is found in the test is automatically repaired by member repair apparatus 25.

In that case, it is not necessary to extract defective silicon wafers 1 from manufacturing carrier 2 to provide a repair carrier (not shown), and defective silicon wafer 1 is repaired while it is mounted on manufacturing carrier 2. For this reason, it is unnecessary to uselessly transfer silicon wafer 1 and to provide a new repair carrier in addition to manufacturing carrier 2.

Therefore, managing data dedicated to repair need not be created in addition to the processing state data for each manufacturing carrier 2, and the repair operation of member repair apparatus 25 can be controlled only by changing the processing status in the processing state data with member test apparatus 23.

Since the condition of the defect occurrence in manufacturing carrier 2 is set in the processing state data by member test apparatus 23 and the data is transferred to data processing apparatus 26, data processing apparatus 26 can manage the condition of the defect occurrence in manufacturing carrier 2 as data, thereby allowing the manufacturing operation and the repair operation to be integrated and controlled with the same processing state data.

Furthermore, data processing apparatus 26 of the embodiment also manages the mounting state data externally input independently of the aforementioned processing state data, and creates and manages the integration state data from the processing state data and the mounting state data. Since the slot numbers, the wafer numbers and the processing statuses correspond to one another in the integration state data, it is possible to integrate and control the current states of the mounting and processing of silicon wafers 1.

Member test apparatus 23 and member repair apparatus 25 perform processing for test and repair, respectively, in holding slots 3 in manufacturing carrier 2, and need not individually recognize silicon wafers 1. Thus, since member test apparatus 23 and member repair apparatus 25 do not hold the integration state data but the processing state data, useless data holding and data communication are not required to allow a saved storage capacity of the information storage medium and a lower communication speed of the communication I/F.

It should be noted that the present invention is not limited to the aforementioned embodiment, and various modifications are allowed without departing from its spirit and scope. For example, while the aforementioned embodiment illustrates by an example silicon wafer 1 as a member to be processed and manufacturing carrier 2 as a member transfer jig, the present invention is applicable to manufacture and repair of various products.

While the aforementioned embodiment illustrates by an example the test of all silicon wafers 1 mounted on manufacturing carrier 2 and the repair of only silicon wafer 1 in which a defect is found, it is possible to test some of silicon wafers 1 mounted on manufacturing carrier 2 and to repair all silicon wafers 1 if a defect is found.

In addition, while the aforementioned embodiment illustrates by an example the repair of defective silicon wafer 1 with the processing state data which includes the test result set by member test apparatus 23 and is transmitted to member repair apparatus 25 through data processing apparatus 26, data processing apparatus 26 may transmit another repair instruction data to member repair apparatus 25 in accordance with the received processing state data.

The aforementioned embodiment illustrates by an example CPU 101 operating in accordance with the control programs stored as software in RAM 104 or the like to logically realize various means as various functions of data processing apparatus 26. However, each of such various means may be formed as specific hardware, or some of them may be stored as software in RAM 104 or the like and the others may be formed as hardware.

Furthermore, while the aforementioned embodiment assumes that the software previously installed on HDD 105 from CD-ROM 108 or the like is copied to RAM 104 at the activation of computer system 2 and the software thus stored in RAM 104 is read by CPU 101, such software may be utilized by CPU 101 while it is stored in HDD 105, or previously stored in ROM 103 in a fixed manner.

Additionally, the software may be stored in FD 106 or CD-ROM 108 which is an information storage medium treatable alone, and then installed on HDD 105 or RAM 104 from FD 106 or the like. However, the software may be read directly from FD 106 or the like by CPU 101 without such installation to perform processing operations.

In brief, when various means of data processing apparatus 26 of the present invention is realized by software, the software has only to be read by CPU 101 to perform corresponding operations. For example, software stored in an information storage medium may be read on-line by computer system 2.

The control programs for realizing the aforementioned various means may be formed of a combination of plural pieces of software. In this case, an information storage medium which is a standalone product may store only minimum software required for realizing data processing apparatus 26 of the present invention.

For example, when computer system 2 which is equipped with an existing operating system is provided with application software through an information storage medium such as CD-ROM 108, since software for realizing various means of data processing apparatus 26 of the present invention is realized by a combination of the application software and the operating system, part of the software depending on the operating system can be omitted from the application software in the information storage medium.

Since the present invention is configured as described above, it produces the following effects.

In the test and repair method with the test and repair system of the present invention, even when a defect is found in some of the plurality of members to be processed transferred collectively on the member transfer jig, the defective member to be processed is transferred and repaired while it is mounted on the member transfer jig. The condition of the defect occurrence in the member transfer jig is set in the processing state data with the member test apparatus. The processing state data is transferred to the data processing apparatus from the member test apparatus. The repair instruction data in accordance with the processing state data is transmitted from the data processing apparatus to the member repair apparatus.

Therefore, the defective member to be processed is repaired while it is mounted on the member transfer jig for normal operation, and it is not necessary to extract the defective member to be processed from the member transfer jig for normal operation and to mount it on a member transfer jig dedicated to repair. As a result, the operation for repairing a defective member to be processed is easily performed with high efficiency, and managing data dedicated to repair need not be created in addition to the processing state data for each member transfer jig. In addition, the data processing apparatus can manage the defective state of the member to be processed with the processing state data for normal operation, and can appropriately control the operation for repairing the defect by the member repair apparatus through simple data processing.

Furthermore, in the aforementioned test and repair system, in the data processing apparatus, the mounting managing means manages the mounting state data in which the member identification data provided respectively for the plurality of members to be processed correspond to the position identification data for each member transfer jig, the data integrating means integrates the mounting state data with the processing state data to create the integration state data, and the integration managing means manages the created integration state data.

Therefore, since the data can be managed with the member identification data provided individually for the members to be processed corresponding to the member current state data for representing the current states of the members to be processed, the data processing apparatus can manage as data the individual current states of the members to be processed even when the member test apparatus and the member repair apparatus do not hold the individual data for a number of the members to be processed.

What is claimed is:

1. A test and repair system comprising a member test apparatus for testing a plurality of members to be processed each mounted at a respective mounting position on manufacturing carrier serving as a member transfer jig, to determine whether each of said members is acceptable or defective, and a member repair apparatus for repairing said member to be processed which is determined as defective by said member test apparatus, a carrier transfer mechanism for transferring the member transfer jig from the member test apparatus to the member repair apparatus, and further comprising a data processing apparatus for integrating and controlling said member test apparatus and said member repair apparatus, wherein said member test apparatus comprises:
  test supporting means for removably supporting said member transfer jig;
  quality determining means for testing said plurality of members to be processed mounted on said member transfer jig supported by said test supporting means to determine whether each of said members is acceptable or defective;
  storage means for storing processing state data in which each of position identification data provided for each of said member mounting positions corresponds to one of a plurality of member current state data for representing a current state of said member to be processed for each said member transfer jig tested by said quality determining means;
  data update means for updating said member current state data in said processing state data stored in said processing storage means in accordance with a result of a determination by said quality determining means; and
  transmitting means for transmitting said processing state data updated by said data update means to said data processing apparatus,
said data processing apparatus comprises:
  receiving means for receiving said processing state data from said member test apparatus;
  data managing means for managing said processing state data received by said state receiving means; and
  transmitting means for transmitting repair instructions to said member repair apparatus in accordance with said processing state data managed by said data managing means,
said member repair apparatus comprises:
  receiving means for receiving said repair instructions from said data processing apparatus;
  repair supporting means for removably supporting said member transfer jig;
  repair performing means for repairing said member to be processed mounted on said member transfer jig supported by said repair supporting means; and
  repair control means for selectively controlling a repair operation of said repair performing means for each of said member mounting positions of said member transfer jig in accordance with said repair instruction data received by said repair receiving means.

2. The test and repair system according to claim 1, wherein said data processing apparatus further comprises:
  mounting managing means for managing mounting state data in which member identification data provided for respective ones of said plurality of members to be processed correspond to said position identification data for each said member transfer jig;
  data integrating means for integrating said mounting state data with said processing state data to create integration state data; and
  integration managing means for managing said integration state data created by said data integrating means.

3. A product manufacturing system comprising the test and repair system according to claim 2 as its part, comprising:

jig transfer means for sequentially transferring said member transfer jig;

various types of manufacturing processing apparatuses disposed on a transfer path of said jig transfer means for performing various types of manufacturing steps on said member to be processed, respectively; and said test and repair system including said member test apparatus disposed in a stage next to a particular one of said manufacturing processing apparatuses.

4. The product manufacturing system according to claim 3, wherein said data processing apparatus of said test and repair system also integrates and controls said manufacturing processing apparatuses.

5. A product manufacturing system comprising the test and repair system according to claim 1 as its part, comprising:

jig transfer means for sequentially transferring said member transfer jig;

various types of manufacturing processing apparatuses disposed on a transfer path of said jig transfer means for performing various types of manufacturing steps on said member to be processed, respectively; and said test and repair system including said member test apparatus disposed in a stage next to a particular one of said manufacturing processing apparatuses.

6. The product manufacturing system according to claim 5, wherein said data processing apparatus of said test and repair system also integrates and controls said manufacturing processing apparatuses.

7. A method of test and repair, comprising the steps of:

testing a plurality of members to be processed each mounted at a respective member mounting position of a manufacturing carrier serving as a member transfer jig, to determine whether each of said members is acceptable or defective;

storing processing state data in which each of position identification data provided for each of said member mounting positions corresponds to one of a plurality of member current state data for representing a current state of said member to be processed for each said member transfer jig to be tested;

updating said member current state data in said stored processing state data in accordance with a determination result in said test;

managing said updated processing state data;

transferring said member transfer jig on a carrier transfer mechanism to a member repair apparatus; and selectively repairing said member to be processed mounted on said member transfer jig for each of said member mounting positions in accordance with said managed processing state data.

8. A method of test and repair in a test and repair system comprising a member test apparatus for testing a plurality of members to be processed each mounted at a member mounting position of a manufacturing carrier serving as a member transfer jig, to determine whether each of said members is acceptable or defective, and a member repair apparatus for repairing said member to be processed which is determined as defective by said member test apparatus, said method comprising the steps of:

connecting a data processing apparatus to said member test apparatus and to said member repair apparatus, removably supporting said member transfer jig, testing said plurality of members to be processed mounted on said supported member transfer jig to determine whether each of said members is acceptable or defective, storing processing state data in which each of position identification data provided for each of said mounting positions corresponds to one of a plurality of member current state data for representing a current state of said member to be processed for each said member transfer jig to be tested, updating said member current state data in said stored processing state data in accordance with a determination result in said test, and transmitting said updated processing state data to said data processing apparatus, by said member test apparatus;

managing said processing state data received from said member test apparatus, and transmitting repair instructions to said member repair apparatus in accordance with said managed processing state data, by said data processing apparatus; and transferring said member transfer jig from said member test apparatus to said member repair apparatus, and selectively repairing said member to be processed mounted on said supported member transfer jig for each of said member mounting positions in accordance with said repair instruction data received from said data processing apparatus, by said member repair apparatus.

* * * * *

UNITED STATES PATENT AND TRADEMARK OFFICE
CERTIFICATE OF CORRECTION

PATENT NO.    : 6,507,186 B1
DATED         : January 14, 2003
INVENTOR(S)   : Sugikawa, Yutaka It is certified that error appears in the above-identified patent and that said Letters Patent is hereby corrected as shown below:

<u>Column 15,</u>
Line 65, please insert -- a -- after "on".

Signed and Sealed this

Twenty-eighth Day of October, 2003

JAMES E. ROGAN
*Director of the United States Patent and Trademark Office*